US009771550B2

(12) United States Patent
Kneer

(10) Patent No.: US 9,771,550 B2
(45) Date of Patent: Sep. 26, 2017

(54) CLEANING FORMULATION FOR REMOVING RESIDUES ON SURFACES

(71) Applicant: Fujifilm Electronic Materials U.S.A., Inc., North Kingstown, RI (US)

(72) Inventor: Emil A. Kneer, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 24 days.

(21) Appl. No.: 14/564,566

(22) Filed: Dec. 9, 2014

(65) Prior Publication Data

US 2015/0159125 A1 Jun. 11, 2015

Related U.S. Application Data

(60) Provisional application No. 61/914,479, filed on Dec. 11, 2013.

(51) Int. Cl.
| | |
|---|---|
| *H01L 21/70* | (2006.01) |
| *C11D 11/00* | (2006.01) |
| *C11D 7/10* | (2006.01) |
| *C11D 7/08* | (2006.01) |
| *H01L 21/02* | (2006.01) |
| *H01L 21/3065* | (2006.01) |
| *C11D 3/00* | (2006.01) |

(52) U.S. Cl.
CPC ........ *C11D 11/0047* (2013.01); *C11D 3/0073* (2013.01); *C11D 7/08* (2013.01); *C11D 7/10* (2013.01); *H01L 21/0206* (2013.01); *H01L 21/3065* (2013.01)

(58) Field of Classification Search
CPC .. H01L 21/0206; H01L 21/3065; H01L 27/04
USPC .......................................... 257/499; 438/800
See application file for complete search history.

(56) References Cited

U.S. PATENT DOCUMENTS

| | | | |
|---|---|---|---|
| 6,063,712 A | 5/2000 | Gilton et al. | |
| 6,391,840 B1* | 5/2002 | Thompson | C11D 1/37 510/372 |
| 6,472,360 B1* | 10/2002 | Beggs | C11D 3/3947 510/372 |
| 6,734,155 B1* | 5/2004 | Herbots | C11D 3/2079 510/300 |
| 6,773,873 B2 | 8/2004 | Baum et al. | |
| 6,982,006 B1* | 1/2006 | Boyers et al. | 134/3 |
| 7,253,111 B2 | 8/2007 | Liu et al. | |
| 7,718,590 B2 | 5/2010 | Suzuki et al. | |
| 8,007,593 B2* | 8/2011 | Miyamoto et al. | 134/1 |
| 8,148,310 B2* | 4/2012 | Lee | 510/175 |
| 2002/0004473 A1* | 1/2002 | Busch | C11D 3/168 510/302 |
| 2002/0119245 A1 | 8/2002 | Verhaverbeke | |
| 2003/0119698 A1* | 6/2003 | Busch | C11D 3/168 510/302 |
| 2004/0188385 A1 | 9/2004 | Yamada et al. | |
| 2004/0224866 A1 | 11/2004 | Matsunaga et al. | |
| 2005/0119143 A1* | 6/2005 | Egbe | C11D 3/0073 510/175 |
| 2005/0178742 A1* | 8/2005 | Chelle | C09G 1/02 216/88 |
| 2005/0261152 A1 | 11/2005 | Carter et al. | |
| 2006/0293199 A1* | 12/2006 | Tamura et al. | 510/175 |
| 2007/0000523 A1 | 1/2007 | Kim et al. | |
| 2007/0060490 A1* | 3/2007 | Skee | C11D 3/0073 510/175 |
| 2008/0050657 A1* | 2/2008 | Nishida et al. | 429/306 |
| 2008/0125343 A1* | 5/2008 | Busch | C11D 3/3932 510/309 |
| 2008/0160743 A1 | 7/2008 | Lee et al. | |
| 2009/0131295 A1 | 5/2009 | Cui | |
| 2009/0301996 A1 | 12/2009 | Visintin et al. | |
| 2010/0065530 A1* | 3/2010 | Walker et al. | 216/13 |
| 2010/0267225 A1* | 10/2010 | Lee | G03F 7/423 438/514 |
| 2011/0039747 A1 | 2/2011 | Zhou et al. | |
| 2011/0186086 A1* | 8/2011 | Minsek et al. | 134/26 |
| 2011/0256712 A1* | 10/2011 | Lee et al. | 438/652 |
| 2012/0009792 A1 | 1/2012 | Park et al. | |
| 2013/0168348 A1* | 7/2013 | Li | C09G 1/02 216/13 |
| 2013/0261268 A1* | 10/2013 | Hood | C09D 139/04 525/326.9 |
| 2013/0288436 A1 | 10/2013 | Chou et al. | |
| 2013/0296214 A1* | 11/2013 | Barnes et al. | 510/176 |
| 2014/0038420 A1* | 2/2014 | Chen et al. | 438/754 |
| 2015/0027978 A1* | 1/2015 | Barnes et al. | 216/13 |
| 2015/0050199 A1* | 2/2015 | Korzenski et al. | 423/98 |

FOREIGN PATENT DOCUMENTS

| | | | |
|---|---|---|---|
| CN | 101883688 | 11/2010 | ............... B44C 1/22 |
| JP | 2010-541192 | 12/2010 | ........... H01L 21/304 |

(Continued)

OTHER PUBLICATIONS

International Search Report and Written Opinion of the International Searching Authority for International Application No. PCT/US14/69258 dated Feb. 24, 2015 (12 pages).
European Patent Office Supplemental Search Report for European Application No. 14868924 dated Jun. 12, 2017 (8 pages).

*Primary Examiner* — Phat X Cao
*Assistant Examiner* — Mohammad M Hoque
(74) *Attorney, Agent, or Firm* — Fish & Richardson P.C.

(57) ABSTRACT

This disclosure relates to a cleaning composition that contains 1) HF; 2) substituted or unsubstituted boric acid; 3) ammonium sulfate; 4) at least one metal corrosion inhibitor; 5) water; and 6) optionally, at least one pH adjusting agent, the pH adjusting agent being a base free of a metal ion. This disclosure also relates to a method of using the above composition for cleaning a semiconductor substrate.

45 Claims, No Drawings

(56) References Cited

FOREIGN PATENT DOCUMENTS

| | | | |
|---|---|---|---|
| JP | 2012-164713 | 8/2012 | ........... H01L 21/304 |
| KR | 10 2008 0064147 | 7/2008 | ................ G03F 7/26 |
| KR | 1020120044630 | 5/2012 | .............. C09K 13/10 |
| KR | 10 2012 0124919 | 11/2012 | .............. C09K 13/04 |
| KR | 10 1294906 | 8/2013 | ......... H01L 21/3063 |
| TW | I350431 | 7/2005 | ................ G03F 7/42 |
| TW | 200706699 | 2/2007 | ................. C23F 1/14 |
| TW | 200731390 | 8/2007 | ........... H01L 21/306 |
| TW | 200918664 | 5/2009 | ............... C11D 7/08 |
| TW | I344998 | 7/2011 | ............. C09K 13/08 |
| TW | I403579 | 8/2013 | ............. C11D 11/00 |
| WO | WO 2012/009639 | 1/2012 | ........... H01L 21/302 |
| WO | WO 2012/154498 | 11/2012 | ........... H01L 31/042 |
| WO | WO 2013/101907 | 7/2013 | ........... H01L 21/311 |
| WO | WO 2013/138276 | 9/2013 | ........... H01L 21/306 |

\* cited by examiner

CLEANING FORMULATION FOR REMOVING RESIDUES ON SURFACES

CROSS-REFERENCE TO RELATED APPLICATION

The present application claims priority to U.S. Provisional Application Ser. No. 61/914,479, filed on Dec. 11, 2013, the contents of which are hereby incorporated by reference in its entirety.

BACKGROUND

1. Field of the Disclosure

The present disclosure relates to a novel cleaning composition for semiconductor substrates and a method of cleaning semiconductor substrates. More particularly, the present disclosure relates to a cleaning composition for removing plasma etch residues formed on semiconductor substrates after plasma etching of metal layers or dielectric material layers deposited on the substrates and the removal of residues left on the substrates after bulk resist removal via a plasma ashing process.

2. Discussion of the Background Art

In the manufacture of integrated circuit devices, photoresists are used as an intermediate mask for transferring the original mask pattern of a reticle onto the wafer substrate by means of a series of photolithography and plasma etching steps. One of the essential steps in the integrated circuit device manufacturing process is the removal of the patterned photoresist films from the wafer substrate. In general, this step is carried out by one of two methods.

One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly crosslinked by such treatments and are more difficult to dissolve in the stripper solution. In addition, the chemicals used in these conventional wet-stripping methods are sometimes ineffective for removing inorganic or organometallic residual materials formed during the plasma etching of metal or oxide layers with halogen-containing gases.

An alternative method of removing a photoresist film involves exposing a photoresist-coated wafer to oxygen-based plasma in order to burn the resist film from the substrate in a process known as plasma ashing. However, plasma ashing is also not fully effective in removing the plasma etching by-products noted above. Instead, removal of these plasma etch by-products is typically accomplished by subsequently exposing the processed metal and dielectric thin films to certain cleaning solutions.

Metal substrates are generally susceptible to corrosion. For example, substrates such as aluminum, copper, aluminum-copper alloy, tungsten nitride, tungsten (W), cobalt (Co), titanium oxide, other metals and metal nitrides, will readily corrode and dielectrics [ILD, ULK] can etch by using conventional cleaning chemistries. In addition the amount of corrosion tolerated by the integrated circuit device manufacturers is getting smaller and smaller as the device geometries shrink.

At the same time as residues become harder to remove and corrosion must be controlled to ever lower levels, cleaning solutions must be safe to use and environmentally friendly.

Therefore, the cleaning solution should be effective for removing the plasma etch and plasma ash residues and must also be non-corrosive to all exposed substrate materials.

SUMMARY OF THE DISCLOSURE

The present disclosure is directed to a non-corrosive cleaning composition that is useful primarily for removing residues (e.g., plasma etch and/or plasma ashing residues) from a semiconductor substrate as an intermediate step in a multistep manufacturing process. These residues include a range of relatively insoluble mixtures of organic compounds like residual photoresist, organometallic compounds, metal oxides which are formed as reaction by-products from exposed metals such as aluminum, aluminum/copper alloy, copper, titanium, tantalum, tungsten, cobalt, metal nitrides such as titanium and tungsten nitrides, and other materials. An advantage of the cleaning composition described herein is that it can clean a broad range of residues encountered and be generally non-corrosive to exposed substrate materials (e.g., exposed metals such as aluminum, aluminum/copper alloy, copper, titanium, tantalum, tungsten, cobalt, and metal nitrides such as titanium and tungsten nitrides).

In one aspect, the present disclosure features a cleaning composition containing 1) HF, 2) substituted or unsubstituted boric acid, 3) ammonium sulfate, 4) at least one metal corrosion inhibitor, 5) water, and 6) optionally, at least one pH adjusting agent, the pH adjusting agent being a base free of a metal ion. In some embodiments, the pH of the cleaning composition is between about 5 and about 6. In some embodiments, the cleaning composition is a uniform solution.

For example, the cleaning composition can include:
1) about 0.01% to about 1% by weight of HF;
2) about 0.01% to about 0.6% by weight of substituted or unsubstituted boric acid;
3) about 0.05% to about 5% by weight of ammonium sulfate;
4) about 0.1% to about 0.6% by weight of at least one metal corrosion inhibitor selected from the group consisting of substituted and unsubstituted benzotriazoles;
5) about 80% to about 99.7% water, and
6) optionally, at least one pH adjusting agent.

In another aspect, the present disclosure features a cleaning composition containing 1) a fluoroborate compound; 2) ammonium sulfate, 3) at least one metal corrosion inhibitor, 4) water, and 5) optionally, at least one pH adjusting agent, the pH adjusting agent being a base free of a metal ion.

For example, the cleaning composition can include:
1) about 0.02% to about 2% by weight of the fluoroborate compound;
2) about 0.05% to about 5% by weight of ammonium sulfate;
3) about 0.1% to about 0.6% by weight of at least one metal corrosion inhibitor selected from the group consisting of substituted and unsubstituted benzotriazoles;
4) about 80% to about 99.7% water, and
5) optionally, at least one pH adjusting agent.

The present disclosure is also directed to a method of cleaning residues from a semiconductor substrate. The method includes contacting a semiconductor substrate containing post etch residues and/or post ash residues with a cleaning composition described herein. For example, the method can include the steps of:

(A) providing a semiconductor substrate containing post etch and/or post ash residues;

(B) contacting said semiconductor substrate with a cleaning composition described herein;

(C) rinsing said semiconductor substrate with a suitable rinse solvent; and (D) optionally, drying said semiconductor substrate by any means that removes the rinse solvent and does not compromise the integrity of said semiconductor substrate.

DETAILED DESCRIPTION OF THE DISCLOSURE

As defined herein, unless otherwise noted, all percentages expressed should be understood to be percentages by weight to the total weight of the cleaning composition. Unless otherwise noted, ambient temperature is defined to be between about 16 and about 27 degrees Celsius (° C.).

One embodiment of the present disclosure is directed to a non-corrosive cleaning composition containing:

1) about 0.01% to about 1% by weight of hydrogen fluoride (HF);

2) about 0.01% to about 0.6% by weight of substituted or unsubstituted boric acid;

3) about 0.05% to about 5% by weight of ammonium sulfate;

4) about 0.1% to about 0.6% by weight of at least one metal corrosion inhibitor selected from the group consisting of substituted and unsubstituted benzotriazoles;

5) about 80% to about 99.7% water, and 6) optionally, at least one pH adjusting agent, the pH adjusting agent being a base free of a metal ion.

In some embodiments, the compositions of this disclosure include at least about 0.01% by weight (e.g., at least about 0.05% by weight, at least about 0.075% by weight, or at least about 0.1% by weight) and/or at most about 1% by weight (e.g., at most about 0.5% by weight, at most about 0.3% by weight, or at most about 0.25% by weight) of HF.

In some embodiments, the compositions of this disclosure include at least about 0.01% by weight (e.g., at least about 0.05% by weight, at least about 0.075% by weight, or at least about 0.1% by weight) and/or at most about 0.5% by weight (e.g., at most about 0.4% by weight, at most about 0.3% by weight, or at most about 0.2% by weight) of substituted or unsubstituted boric acid.

In some embodiments, the compositions of this disclosure employ unsubstituted boric acid of the formula $R^1B(OH)_2$, in which $R^1$ is OH. In other embodiments, the compositions of this disclosure employ substituted boric acids of the formula $R^1B(OH)_2$, where $R^1$ is a substituted or unsubstituted alkyl group (e.g., $C_1$-$C_{10}$ alkyl optionally substituted by a substituted or unsubstituted aryl (e.g., arylalkyl such as benzyl)), or a substituted or unsubstituted aryl group. Examples of substituents on the aryl group (including the aryl of the arylalkyl group) include substituted or unsubstituted $C_1$-$C_{10}$ alkyl (e.g., methyl, ethyl, or trifluoromethyl), halo (e.g., F, Cl, Br, or I), nitro, and alkoxy (e.g., methoxy). Examples of substituents on the alkyl group include aryl groups (e.g., phenyl).

Examples of substituted boric acids include phenyl boric acid, chlorophenyl boric acid, bromophenyl boric acid, fluorophenyl boric acid, trifluoromethylphenyl boric acid, methylphenyl boric acid, methyl boric acid, and benzyl boric acid.

In some embodiments, the compositions of this disclosure employ a fluoroborate compound. Fluoroborate compounds contemplated include compounds having a suitable cation (e.g., $H^+$) and a fluoroborate anion of the formula $(R^2)_xB(F)_{4-x}^-$ in which $R^2$ is substituted or unsubstituted alkyl, or substituted or unsubstituted aryl, and wherein x is 0, 1, 2, or 3. In some embodiments, the fluoroborate compounds contain a tetrafluoroborate or a trifluoroborate anion and a suitable cation. In such embodiments, when x is 0, the compound can be fluoroboric acid or a tetrafluoroborate salt. In some embodiments, tetrafluoroborate salts include those with substituted or unsubstituted ammonium cations (e.g., ammonium cation and quaternary ammonium cations such as tetramethylammonium, tetraethylammonium, and N,N-diethyl-N-methyl-(2-methoxyethyl)ammonium). Alkali metal (e.g. Li, Na, or K) tetrafluororoborate salts could also be employed.

In some embodiments, the compositions can include a fluoroborate anion of the formula $R^2B(F)_3^-$, in which $R^2$ is substituted or unsubstituted alkyl (e.g., arylalkyl) or substituted or unsubstituted aryl.

Examples of suitable cations include, but are not limited to, substituted or unsubstituted ammonium cations (e.g., ammonium and quaternary ammonium cations such as tetramethylammonium, tetraethylammonium, and N,N-diethyl-N-methyl-(2-methoxyethyl)ammonium). Alkali metal (e.g. Li, Na, or K) tetrafluororoborate salts could also be employed.

Examples of alkyl, aryl, or arylalkyl trifluoroborate anion include, but are not limited to, phenyltrifluoroborate, chlorophenyltrifluoroborate, fluorophenyltrifluoroborate, methylphenyltrifluoroborate, trifluoromethylphenyltrifluoroborate, methyltrifluoroborate and benzyltrifluoroborate. Examples of specific alkyl, aryl, or arylalkyl trifluoroborate salts include, but are not limited to, the combinations of the ammonium and quaternary ammonium cations listed above with the alkyl, aryl, or arylalkyl trifluoroborate listed anions.

In some embodiments, the compositions of this disclosure include at least about 0.02% by weight (e.g., at least about 0.1% by weight, at least about 0.15% by weight, or at least about 0.2% by weight) and/or at most about 2% by weight (e.g., at most about 1% by weight, at most about 0.6% by weight, or at most about 0.5% by weight) of the fluoroborate compound.

In some embodiments, the compositions of this disclosure include at least about 0.05% by weight (e.g., at least about 0.2% by weight, at least about 0.4% by weight, or at least about 0.5% by weight) and/or at most about 5% by weight (e.g., at most about 4% by weight, at most about 3% by weight, or at most about 2.5% by weight) of ammonium sulfate.

The compositions of this disclosure contain at least one metal corrosion inhibitor such as substituted or unsubstituted benzotriazoles. Suitable classes of substituted benzotriazole include, but are not limited to benzotriazoles substituted with alkyl groups, aryl groups, halogen groups, amino groups, nitro groups, alkoxy groups, and hydroxyl groups. Substituted benzotriazoles also include those fused with one or more aryl (e.g., phenyl) or heteroaryl groups.

Suitable benzotriazoles for use as a metal corrosion inhibitor include, but are not limited to, benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-aminobenzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-dimethylpropyl)-benzotriazole, 5-(1',1',3'-trimethylbutyl)benzotriazole, 5-n-octyl benzotriazole, and 5-(1',1',3',3'-tetramethylbutyl) benzotriazole.

In some embodiments, the compositions of this disclosure include at least about 0.1% by weight (e.g., at least about 0.15% by weight, at least about 0.2% by weight, or at least about 0.22% by weight) and/or at most about 0.6% by weight (e.g., at most about 0.5% by weight, at most about 0.45% by weight, or at most about 0.4% by weight) of the metal corrosion inhibitor.

The cleaning compositions of the present disclosure further include water. Preferably, the water is de-ionized and ultra-pure, contains no organic contaminants and has a minimum resistivity of about 4 to about 17 mega Ohms. More preferably, the resistivity of the water is at least 17 mega Ohms.

In some embodiments, the compositions of this disclosure include at least about 80% by weight (e.g., at least about 85% by weight, at least about 90% by weight, or at least about 95% by weight) and/or at most about 99.7% by weight (e.g., at most about 99.5% by weight, at most about 99% by weight, or at most about 98% by weight) of water.

The compositions of this disclosure optionally contains at least one pH adjusting agent to control the pH to between about 5 to about 6. In some embodiments, the compositions of this disclosure can have a pH of at least about 5 (e.g., at least about 5.1, at least about 5.2, or at least about 5.3) to at most about 6 (e.g., at most about 5.9, at most about 5.8, or at most about 5.7). Without wishing to be bound by theory, it is believed that a cleaning composition having a pH higher than 6 decreases the plasma etch residue cleaning to an impractical level for complete cleaning and that a pH lower than 5 would increase the etch rate of Co to an undesirable level.

The amount of pH adjusting agent required, if any, can vary as the concentration of the other components is varied in different formulations, particularly the HF, and as a function of the molecular weight of the particular pH adjusting agent employed. In general, the pH adjusting agent concentration ranges from about 0% to about 3%. In some embodiments, the cleaning compositions of this disclosure include at least about 0% by weight (e.g., at least about 0.05% by weight, at least about 0.3% by weight, or at least about 0.5% by weight) and/or at most about 3% by weight (e.g., at most about 2.5% by weight, at most about 2% by weight, or at most about 1.5% by weight) of the pH adjusting agent.

In general, the pH adjusting agent is free of any metal ion (except for a trace amount of metal ion impurities). Suitable metal ion free pH adjusting agents include ammonium hydroxide, quaternary ammonium hydroxides, monoamines (including alkanolamines), imines (such as 1,8-diazabicyclo[5.4.0]-7-undecene and 1,5-diazabicyclo[4.3.0]-5-nonene), and guanidine salts (such as guanidine carbonate).

Examples of suitable quaternary ammonium hydroxides, include, but are not limited to tetramethyl ammonium hydroxide, tetraethyl ammonium hydroxide, tetrapropyl ammonium hydroxide, tetrabutyl ammonium hydroxide, dimethyldiethylammonium hydroxide, choline, tetraethanolammonium hydroxide, benzyltrimethylammonium hydroxide, benzyltriethylammonium hydroxide, and benzyltributylammonium hydroxide.

Examples of suitable monoamines include, but are not limited to, triethylamine, tributylamine, tripentylamine, ethanolamine, diethanolamine, diethylamine, butylamine, dibutylamine, and benzylamine.

In some embodiments, the non-corrosive cleaning composition of this disclosure contains, consists, or consists essentially of at least about 0.01% by weight (e.g., at least about 0.05% by weight, at least about 0.075% by weight, or at least about 0.1% by weight) and/or at most about 1% by weight (e.g., at most about 0.5% by weight, at most about 0.3% by weight, or at most about 0.25% by weight) of HF, at least about 0.01% by weight (e.g., at least about 0.05% by weight, at least about 0.075% by weight, or at least about 0.1% by weight) and/or at most about 0.5% by weight (e.g., at most about 0.4% by weight, at most about 0.3% by weight, or at most about 0.2% by weight) of boric acid, at least about 0.05% by weight (e.g., at least about 0.2% by weight, at least about 0.4% by weight, or at least about 0.5% by weight) and/or at most about 5% by weight (e.g., at most about 4% by weight, at most about 3% by weight, or at most about 2.5% by weight) of ammonium sulfate, at least about 0.1% by weight (e.g., at least about 0.15% by weight, at least about 0.2% by weight, or at least about 0.22% by weight) and/or at most about 0.6% by weight (e.g., at most about 0.5% by weight, at most about 0.45% by weight, or at most about 0.4% by weight) of the metal corrosion inhibitor, at least about 80% by weight (e.g., at least about 85% by weight, at least about 90% by weight, or at least about 95% by weight) and/or at most about 99.7% by weight (e.g., at most about 99.5% by weight, at most about 99% by weight, or at most about 98% by weight) of water; and optionally, at least about 0% by weight (e.g., at least about 0.05% by weight, at least about 0.3% by weight, or at least about 0.5% by weight) and/or at most about 3% by weight (e.g., at most about 2.5% by weight, at most about 2% by weight, or at most about 1.5% by weight) of the pH adjusting agent, wherein the pH of the non-corrosive cleaning composition is from at least 5 (e.g., at least about 5.1, at least about 5.2, or at least about 5.3) to at most about 6 (e.g., at most about 5.9, at most about 5.8, or at most about 5.7).

In addition, in some embodiments, the cleaning compositions of the present disclosure may contain additives such as, additional pH adjusting agents, additional corrosion inhibitors, surfactants, organic solvents, and biocides.

In some embodiments, the cleaning compositions of the present disclosure may specifically exclude one or more components or classes of compounds in any combination, if more than one. Such components are selected from the group consisting of organic solvents, oxygen scavengers, quaternary ammonium hydroxides, amines, alkaline bases (such as NaOH, KOH, and LiOH), surfactants, defoamers, fluoride containing compounds other than those disclosed herein, oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), inorganic acids other than those disclosed herein (e.g., $H_5IO_6$, nitric acid, sulfuric acid, hydrochloric acid, phosphoric acid, and the like), abrasives, hydroxycarboxylic acids, carboxylic and polycarboxylic acids lacking amino groups, non-azole corrosion inhibitors, and metal halides of the formula $W_zMX_y$, wherein W is selected from the group consisting of H, an alkali or alkaline earth metal, and a metal-ion-free hydroxide base moiety; M is a metal selected from the group consisting of Si, Ge, Sn, Pt, P, B, Au, Ir, Os, Cr, Ti, Zr, Rh, Ru and Sb; y is 4, 5, or 6; and z is 1, 2, or 3.

In general, the cleaning compositions of the present disclosure are not specifically designed to remove bulk photoresist films from semiconductor substrates. Rather, the cleaning compositions of the present disclosure are generally designed to remove all residues after bulk resist removal by dry or wet stripping methods. Therefore, the cleaning method of the present disclosure is preferably employed after a dry or wet photoresist stripping process. This photoresist stripping process is generally preceded by a pattern transfer process, such as an etch or implant process, or it is done to correct mask errors before pattern transfer. The chemical makeup of the residue will depend on the process or processes preceding the cleaning step.

Any suitable dry stripping process can be used to remove bulk resist from semiconductor substrates. Examples of suitable dry stripping processes include oxygen based plasma ashing, such as a fluorine/oxygen plasma or a $N_2/H_2$ plasma; ozone gas phase-treatment; fluorine plasma treatment, hot $H_2$ gas treatment (such as that described in U.S. Pat. No. 5,691,117 incorporated herein by reference in its entirety), and the like. In addition, any conventional organic wet stripping solution known to a person skilled in the art can be used to remove bulk resist from semiconductor substrates.

A preferred stripping process used in combination with the cleaning method of the present disclosure is a dry stripping process. Preferably, this dry stripping process is the oxygen based plasma ashing process. This process removes most of the photoresist from the semiconductor substrate by applying a reactive-oxygen atmosphere at elevated temperatures (typically 250° C.) at vacuum conditions (i.e. 1 torr). Organic materials are oxidized by this process and are removed with the process gas. However, this process does not remove inorganic or organometallic contamination from the semiconductor substrate. A subsequent cleaning of the semiconductor substrate with the cleaning composition of the present disclosure is typically necessary to remove those residues.

One embodiment of the present disclosure is a method of cleaning residues from a semiconductor substrate that includes contacting a semiconductor substrate containing post etch residues and/or post ash residues with a cleaning composition described herein. The method can further include rinsing the semiconductor substrate with a rinse solvent after the contacting step and/or drying the semiconductor substrate after the rinsing step.

In some embodiments, the cleaning method include the steps of:

(A) providing a semiconductor substrate containing post etch and/or post ash residues;

(B) contacting said semiconductor substrate with a cleaning composition described herein;

(C) rinsing said semiconductor substrate with a suitable rinse solvent; and (D) optionally, drying said semiconductor substrate by any means that removes the rinse solvent and does not compromise the integrity of said semiconductor substrate.

In some embodiments, the cleaning method further includes forming a semiconductor device (e.g., an integrated circuit device such as a semiconductor chip) from the semiconductor substrate obtained by the method described above.

The semiconductor substrates to be cleaned in this method can contain organic and organometallic residues, and additionally, a range of metal oxides that need to be removed. Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, and silicon, titanium nitride, tantalum nitride, and tungsten. Said semiconductor substrate may also contain layers of interlayer dielectrics, silicon oxide, silicon nitride, silicon carbide, titanium oxide, and carbon doped silicon oxides.

The semiconductor substrate can be contacted with a cleaning composition by any suitable method, such as placing the cleaning composition into a tank and immersing and/or submerging the semiconductor substrates into the cleaning composition, spraying the cleaning composition onto the semiconductor substrate, streaming the cleaning composition onto the semiconductor substrate, or any combinations thereof. Preferably, the semiconductor substrates are immersed into the cleaning composition.

The cleaning compositions of the present disclosure may be effectively used up to a temperature of about 90° C. Preferably, the cleaning compositions can be used from about 25° C. to about 80° C. More preferably, the cleaning compositions can be employed in the temperature range from about 30° C. to about 65° C. and most preferred is a temperature range of about 40° C. to about 65° C.

Similarly, cleaning times can vary over a wide range depending on the particular cleaning method and temperature employed. When cleaning in an immersion batch type process, a suitable time range is, for example, up to about 60 minutes. A preferred range for a batch type process is from about 1 minute to about 60 minutes. A more preferred time range for a batch type process is from about 3 minutes to about 20 minutes. A most preferred time range for a batch type cleaning process is from about 4 minutes to about 15 minutes.

Cleaning times for a single wafer process may range from about 10 seconds to about 5 minutes. A preferred cleaning time for a single wafer process may range from about 30 seconds to about 5 minutes. A more preferred cleaning time for a single wafer process may range from about 1 minute to about 4 minutes. A most preferred cleaning time for a single wafer process may range from about 2 minutes to about 4 minutes.

To further promote the cleaning ability of the cleaning composition of the present disclosure, mechanical agitation means may be employed. Examples of suitable agitation means include circulation of the cleaning composition over the substrate, streaming or spraying the cleaning composition over the substrate, and ultrasonic or megasonic agitation during the cleaning process. The orientation of the semiconductor substrate relative to the ground may be at any angle. Horizontal or vertical orientations are preferred.

Subsequent to the cleaning, the semiconductor substrate is rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, aqueous rinses with pH >8 (such as dilute aqueous ammonium hydroxide) may be employed. Preferred examples of rinse solvents include, but are not limited to, dilute aqueous ammonium hydroxide, DI water, methanol, ethanol and isopropyl alcohol. More preferred rinse solvents are dilute aqueous ammonium hydroxide, DI water and isopropyl alcohol. The most preferred rinse solvents are dilute aqueous ammonium hydroxide and DI water. The solvent may be applied using means similar to that used in applying a cleaning composition described herein. The cleaning composition may have been removed from the semiconductor substrate prior to the start of the rinsing step or it may still be in contact with the semiconductor substrate at the start of the rinsing step. Preferably, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Marangoni drying, rotagoni drying, IPA drying or any combinations thereof. Drying times will be dependent on the specific method employed but are typically on the order of 30 seconds up to several minutes.

In some embodiments, a method of manufacturing an integrated device using a cleaning composition described herein can include the following steps. First, a layer of a photoresist is applied to a semiconductor substrate. The semiconductor substrate thus obtained can then undergo a pattern transfer process, such as an etch or implant process, to form an integrated circuit. The bulk of the photoresist can then be removed by a dry or wet stripping method (e.g., an oxygen based plasma ashing process). Remaining residues on the semiconductor substrate can then be removed using a cleaning composition described herein in the manner described above. The semiconductor substrate can subsequently be processed to form one or more additional circuits on the substrate or can be processed to form into a semiconductor chip by, for example, assembling (e.g., dicing and bonding) and packaging (e.g., chip sealing).

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a 1 inch stirring bar at 250 rpm unless otherwise noted.

General Procedure 1

Formulation Blending

Samples of cleaning compositions were prepared using commercially available and of high purity ingredients by adding, while stirring, to the calculated amount of ultra-pure deionized water (DIW), the components of the cleaning formulation except the for the metal ion free pH adjuster. The cleaning compositions were then transferred to individual 600 ml Teflon beakers, covered with PARAFILM® M, and heated to 65° C. The temperature was measured using Teflon coated glass thermometers to prevent fluoride anion depletion from reactions with exposed glass. The PARAFILM® M cover was removed to adjust the pH by adding the pH adjusting agent drop wise until the pH target was reached. Once the pH was confirmed using a HF resistant pH probe, the individual Teflon beakers were re-covered with PARAFILM® M.

General Procedure 2

Cleaning Evaluation with Beaker Test

The cleaning of PER (Post Etch Residue) from a substrate was carried out with the described cleaning compositions using a multilayered substrate of photoresist/TiOx/SiN/Co/ILD (ILD=Inter Layer Dielectric) or photoresist/TiOx/SiN/W/ILD that had been patterned lithographically, etched in a plasma metal etcher, and followed by oxygen plasma ashing to remove the top layer of photoresist completely.

The test coupons were held using 4" long plastic locking tweezers, whereby the coupon could then be suspended into a 600 ml volume Teflon beaker containing approximately 200 milliliters of the cleaning compositions of the present disclosure. Prior to immersion of the coupon into the cleaning composition, the composition was pre-heated to the desired test condition temperature (65° C.) with controlled stirring. The cleaning tests were then carried out by placing the coupon which was held by the plastic tweezers into the heated composition in such a way that the PER layer containing side of the coupon faced the stir bar. The coupon was left static in the cleaning composition for 3-20 minutes while the composition was kept at the test temperature under controlled stirring. When the desired cleaning time was completed, the coupon was quickly removed from the cleaning composition and rinsed in a dilute NH4OH solution at pH ~10 for 30 seconds with moderate agitation at ambient temperature followed by a DI water stream at ambient temperature for about 30 seconds. The coupon was immediately exposed to a nitrogen gas stream from a hand held nitrogen blowing gun, which caused any droplets on the coupon surface to be blown off the coupon, and further, to completely dry the coupon device surface. Following this final nitrogen drying step, the coupon was removed from the plastic tweezers holder and placed into a covered plastic carrier with the device side up for short term storage. The scanning electron microscopy (SEM) images were then collected for key features on the cleaned test coupon device surface.

General Procedure 3

Materials Compatibility Evaluation with Beaker Test

The blanket Co on silicon substrate, W on silicon substrate, TiOx on $SiO_2$ on silicon substrate, SiN on silicon substrate, ILD on $SiO_2$ on silicon substrate were diced into approximately 1 inch×1 inch square test coupons for the materials compatibility tests. The test coupons were initially measured for thickness or sheet resistance by the 4-point probe, CDE Resmap 273 for metallic film (Co, W), or by Elipsometry for dielectric film (TiOx, SiN and ILD) using a Woollam M-2000x. The test coupons were then installed on the 4" long plastic locking tweezers and treated as described in the cleaning procedure in General Procedure 2 with the Co, W, TiOx, SiN, or ILD layer containing side of the coupon faced the stir bar for 10 minutes.

After the final nitrogen drying step, the coupon was removed from the plastic tweezers holder and placed into a covered plastic carrier. The post-thickness or sheet resistance was then collected on the post-processing test coupon surface by the 4-point probe, CDE Resmap 273 for metallic film (Co and W) or by Elipsometry for dielectric film (TiOx, SiN and ILD) using a Woollam M-2000x.

Formulation Examples FE-1-FE-6 and Comparative Formulation Examples CFE-1-CFE-2

Table 1 summarizes formulation examples FE-1-FE-6 and comparative formulation examples CFE-1-CFE-2 prepared by General Procedure 1.

Cleaning of Post Etch Residue

Comparative Formulation Example CFE-2, and Formulation Examples FE-4, FE-5 and FE-6 were also tested for cleaning according to General Procedure 2. In general, it is desirable to have etch rates for Co, W, SiN, SiC, and ILD as low as possible, while having a balanced etch rate for TiOx (e.g., from about 4 to about 6 angstroms/minute). The results from the cleaning tests obtained from General Procedure 2 showed that CFE-2 exhibited poor cleaning, while FE-4, FE-5, and FE-6 exhibited excellent cleaning capability.

The results in Table 2 obtained from General Procedure 3 and in the cleaning tests obtained from General Procedure 2 show that Comparative Formulation Examples CFE-1 (without boric acid) and CFE-2 (without ammonium sulfate) either had high SiN etch rates or did not clean the substrate. Unexpectedly, the results show that Formulation Examples of this disclosure (e.g., FE-1 to FE-6) exhibited lower SiN

TABLE 1

| Formulation Example | HF | Boric Acid | Ammonium Sulfate | Corr. Inhib. | Water | pH adjuster | pH |
|---|---|---|---|---|---|---|---|
| CFE-1 | 0.10% | 0% | 2.50% | BTA (0.5%) | 96.20% | DBU (0.72%) | 5.2 |
| CFE-2 | 0.10% | 0.095% | 0% | 5MBTA (0.22%) | 98.90% | DBU (0.735%) | 5.4 |
| FE-1 | 0.10% | 0.100% | 2.50% | BTA (0.5%) | 96.10% | DBU (0.72%) | 5.2 |
| FE-2 | 0.10% | 0.095% | 2.50% | BTA (0.5%) | 96.10% | DBU (0.744%) | 5.46 |
| FE-3 | 0.125% | 0.095% | 2.50% | BTA (0.5%) | 96.90% | DBU (0.958%) | 5.25 |
| FE-4 | 0.10% | 0.095% | 2.50% | 5MBTA (0.22%) | 96.40% | DBU (0.729%) | 5.4 |
| FE-5 | 0.10% | 0.095% | 1.25% | 5MBTA (0.22%) | 97.60% | DBU (0.7%) | 5.25 |
| FE-6 | 0.10% | 0.095% | 1.25% | 5MBTA (0.44%) | 97.40% | DBU (0.7%) | 5.28 |

5MBTA = 5-methylbenzotriazole; BTA = benzotriazole; DBU = 1,8-diazabicyclo[5.4.0]undec-7-ene.

Examples 1-6 and Comparative Examples CE1-CE2

Compatibility of Cleaners with Exposed Films

Formulation Examples FE-1-FE-6 and Comparative Formulation Examples CFE-1-CFE-2 were tested for materials compatibility according to General Procedure 3 at 65° C. for 10 minutes. Table 2 summarizes the etch rates (Angstroms/minute) of Co, W, TiOx, SiN, SiC, and ILD for the cleaning compositions obtained from the materials compatibility test according to General Procedure 3.

TABLE 2

| Example | Formulation Example | Co | W | $TiO_x$ | SiN | SiC | ILD |
|---|---|---|---|---|---|---|---|
| CE-1 | CFE-1 | 0 | 1.2 | 5.67 | 6.8 | NM | NM |
| CE-2 | CFE-2 | 0.07 | 0.8 | 0.82 | 0.89 | 0 | 0 |
| 1 | FE-1 | 0 | 0.3 | 4.52 | 1.56 | NM | NM |
| 2 | FE-2 | 1.02 | 1.6 | 4.3 | 3.25 | 0 | 0 |
| 3 | FE-3 | 5.22 | 1.2 | 5.8 | 5.24 | 0 | 0 |
| 4 | FE-4 | 2.13 | 1.1 | 4.82 | 1.76 | 0 | 0 |
| 5 | FE-5 | 2.02 | 1.35 | 5.1 | 3.12 | NM | NM |
| 6 | FE-6 | 0.06 | 1.05 | 4.46 | 2.65 | NM | NM |

NM = not measured.

etch rate, while still maintaining compatibility with other metals and exhibiting excellent cleaning ability.

Formulation Examples 7-27

To further elaborate on the compositions of this disclosure, additional cleaning compositions are described in Tables 3 and 4. The substituted boric acids in Table 3 have the structures defined below:

| Substituted Boric Acid # ($R^1B(OH)_2$) | $R^1$ |
|---|---|
| 1 | —$CH_2CH_2CH_2CH_3$ |
| 2 | —$CH_2CH_2CH_2CH_2CH_2CH_3$ |
| 3 | -benzyl |
| 4 | —$CH_2CH_2$—Ph (Ph = phenyl) |
| 5 | —$CH_2CH_2CH_2$-(4-methyl-phenyl) |
| 6 | —Ph |
| 7 | (4-nitro-phenyl)- |
| 8 | (3-methoxy-phenyl)- |
| 9 | (2-chloro-phenyl)- |
| 10 | (4-ethyl-phenyl)-. |

The fluoroborate compounds in Table 4 contain a fluoroborate anion of $(R^2)_xB(F)_{4-x}^-$ and have the structures defined below:

| Fluoroborate anion | x | R² | Cation |
|---|---|---|---|
| 11 | 0 | NA | $NH_4^+$ |
| 12 | 1 | —$CH_3$ | $N(CH_3)_4^+$ |
| 13 | 2 | —$CH_2CH_2CH_3$ | $N(CH_2CH_3)_4^+$ |
| 14 | 1 | -benzyl | N,N-diethyl-N-methyl-(2-methoxy)ammonium |
| 15 | 3 | -phenyl | $NH(CH_3)_3^+$ |
| 16 | 1 | (4-trifluoromethyl-phenyl)- | $N(CH_2CH_3)(CH_3)_3^+$ |
| 17 | 1 | (4-methyl-phenyl)- | $NH(CH_2CH_3)_3^+$ |
| 18 | 1 | (3-fluoro-phenyl)- | $NH_4^+$ |
| 19 | 1 | (4-methoxy-phenyl)- | $NH_4^+$ |
| 20 | 1 | (2-chloro-phenyl)- | $NH_4^+$ |
| 21 | 0 | NA | $H_3O^+$ |

NA = not applicable

TABLE 3

| Form. Ex. | HF | Boric Acid # | $(NH_4)_2SO_4$ | Corr. Inhib. | $H_2O$ |
|---|---|---|---|---|---|
| FE-7 | 0.01% | 1 0.01% | 0.75% | BTA 0.10% | 99.23% |
| FE-8 | 0.02% | 2 0.05% | 0.50% | 5-methyl-BTA 0.20% | 99.23% |
| FE-9 | 0.03% | 3 0.1% | 1.0% | 5-Cl-BTA 0.30% | 98.55% |
| FE-10 | 0.04% | 4 0.2% | 2.0% | 5-phenyl-BTA 0.40% | 97.2% |
| FE-11 | 0.05% | 5 0.3% | 3.0% | 1-amino-BTA 0.50% | 95.8% |
| FE-12 | 0.06% | 6 0.4% | 4.0% | 5-nitro-BTA 0.60% | 94.4% |
| FE-13 | 0.07% | 7 0.5% | 5.0% | 1-hydroxy-BTA 0.25% | 93.45% |
| FE-14 | 0.08% | 8 0.6% | 2.5% | 4-fluoro-BTA 0.10% | 95.8% |
| FE-15* | 0.09% | 9 0.07% | 3.5% | naphtho-benzotriazole 0.25% | 95.38% |
| FE-16** | 0.1% | 10 0.1% | 3.0% | 5-amino-BTA 0.50% | 95.75% |

BTA = benzotriazole
*Formulation also contains 0.5% DBU;
**Formulation also contains 0.4% tetramethylammonium hydroxide (TMAH);

TABLE 4

| Form. Ex. | Fluoroborate compound # | $(NH_4)_2SO_4$ | Corr. Inhib. | $H_2O$ |
|---|---|---|---|---|
| FE-17 | 11 0.02% | 0.75% | BTA 0.10% | 99.04% |
| FE-18 | 12 0.05% | 0.50% | 5-methyl-BTA 0.20% | 99.25% |
| FE-19 | 13 0.1% | 1.0% | 5-Cl-BTA 0.30% | 98.6% |
| FE-20 | 14 0.06% | 2.0% | 5-phenyl-BTA 0.40% | 97.4% |
| FE-21 | 15 0.3% | 3.0% | 1-amino-BTA 0.50% | 96.2% |
| FE-22 | 16 0.04% | 4.0% | 5-nitro-BTA 0.60% | 95% |
| FE-23 | 17 0.05% | 5.0% | 1-hydroxy-BTA 0.25% | 94.25% |
| FE-24 | 18 0.03% | 2.5% | 4-fluoro-BTA 0.10% | 96.8% |
| FE-25* | 19 0.07% | 3.5% | naphtha-triazole 0.25% | 95.68% |
| FE-26** | 20 0.1% | 3.0% | 5-amino-BTA 0.50% | 96% |
| FE-27 | 21 0.02% | 0.75% | BTA 0.10% | 99.04% |

BTA = benzotriazole
*Formulation also contains 0.5% DBU;
**Formulation also contains 0.4% tetramethylammonium hydroxide (TMAH);

What is claimed is:

1. A cleaning composition, comprising:
   1) HF;
   2) substituted or unsubstituted boric acid;
   3) ammonium sulfate;
   4) at least one metal corrosion inhibitor;
   5) water; and
   6) optionally, at least one pH adjusting agent, the pH adjusting agent being a base free of a metal ion;
   wherein the cleaning composition does not contain an oxidizing agent.

2. The composition of claim 1, wherein the pH of the composition is between 5 and about 6.

3. The composition of claim 1, wherein the composition comprises from about 0.01% to about 1% by weight of HF.

4. The composition of claim 1, wherein the composition comprises from about 0.01% to about 0.1% by weight of HF.

5. The composition of claim 1, wherein the substituted or unsubstituted boric acid is of the formula $R^1B(OH)_2$, in which $R^1$ is OH, substituted or unsubstituted alkyl, or substituted or unsubstituted aryl.

6. The composition of claim 5, wherein $R^1$ is OH.

7. The composition of claim 5, wherein $R^1$ is $C_1$-$C_{10}$ alkyl optionally substituted by a substituted or unsubstituted aryl, or aryl optionally substituted by a substituted or unsubstituted $C_1$-$C_{10}$ alkyl, halo, nitro, or $C_1$-$C_{10}$ alkoxy.

8. The composition of claim 1, wherein the composition comprises from about 0.01% to about 0.6% by weight of the substituted or unsubstituted boric acid.

9. The composition of claim 1, wherein the composition comprises from about 0.05% to about 5% by weight of ammonium sulfate.

10. The composition of claim 1, wherein the metal corrosion inhibitor is a substituted or unsubstituted benzotriazole.

11. The composition of claim 10, wherein the metal corrosion inhibitor is benzotriazole optionally substituted by at least one substituent selected from the group consisting of alkyl groups, aryl groups, halogen groups, amino groups, nitro groups, alkoxy groups, and hydroxyl groups.

12. The composition of claim 11, wherein the metal corrosion inhibitor is selected from the group consisting of benzotriazole, 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-dimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

13. The composition of claim 1, wherein the composition comprises from about 0.1% to about 0.6% by weight of the metal corrosion inhibitor.

14. The composition of claim 1, wherein the composition comprises from about 80% to about 99.7% of the water.

15. The composition of claim 1, further comprising at least one pH adjusting agent, the pH adjusting agent being a base free of a metal ion.

16. The composition of claim 15, wherein the pH adjusting agent is a quaternary ammonium hydroxide, a monoamine, an imine, or a guanidine salt.

17. A cleaning composition, comprising:
1) a fluoroborate compound;
2) ammonium sulfate;
3) at least one metal corrosion inhibitor;
4) water; and
5) optionally, at least one pH adjusting agent, the pH adjusting agent being a base free of a metal ion;
wherein the cleaning composition does not contain an oxidizing agent.

18. The composition of claim 17, wherein the fluoroborate compound comprises a suitable cation and a fluoroborate anion of the formula $(R^2)_xB(F)_{4-x}^-$, wherein $R^2$ is substituted or unsubstituted alkyl, or substituted or unsubstituted aryl, and wherein x is 0, 1, 2, or 3.

19. The composition of claim 18, wherein the fluoroborate anion is of the formula $R^2B(F)_3^-$, wherein $R^2$ is substituted or unsubstituted alkyl, or substituted or unsubstituted aryl.

20. The composition of claim 18, wherein the fluoroborate compound is fluoroboric acid or a tetrafluoroborate salt.

21. The composition of claim 18, wherein the fluoroborate compound is an ammonium tetrafluoroborate salt or a quaternary ammonium tetrafluoroborate salt.

22. The composition of claim 19, wherein $R^2$ is $C_1$-$C_{10}$ alkyl optionally substituted by a substituted or unsubstituted aryl, or aryl optionally substituted by a substituted or unsubstituted $C_1$-$C_{10}$ alkyl, halo, nitro, or $C_1$-$C_{10}$ alkoxy.

23. The composition of claim 18, wherein the fluoroborate compound is an ammonium trifluoroborate salt or a quaternary ammonium trifluoroborate salt.

24. A method, comprising:
contacting a semiconductor substrate containing post etch residues and/or post ash residues with a cleaning composition of claim 1.

25. The method of claim 24, further comprising rinsing the semiconductor substrate with a rinse solvent after the contacting step.

26. The method of claim 25, further comprising drying the semiconductor substrate after the rinsing step.

27. The method of claim 26, further comprising forming a semiconductor device from the semiconductor substrate.

28. A method, comprising:
contacting a semiconductor substrate containing post etch residues and/or post ash residues with a cleaning composition of claim 17.

29. The method of claim 28, further comprising rinsing the semiconductor substrate with a rinse solvent after the contacting step.

30. The method of claim 29, further comprising drying the semiconductor substrate after the rinsing step.

31. The method of claim 30, further comprising forming a semiconductor device from the semiconductor substrate.

32. A semiconductor device prepared from the method of claim 24.

33. The device of claim 32, wherein the semiconductor device is an integrated circuit device.

34. A semiconductor device prepared from the method of claim 28.

35. The device of claim 34, wherein the semiconductor device is an integrated circuit device.

36. The composition of claim 17, wherein the pH of the composition is between 5 and about 6.

37. The composition of claim 17, wherein the composition comprises from about 0.02% to about 2% by weight of the fluoroborate compound.

38. The composition of claim 17, wherein the composition comprises from about 0.05% to about 5% by weight of ammonium sulfate.

39. The composition of claim 17, wherein the metal corrosion inhibitor is a substituted or unsubstituted benzotriazole.

40. The composition of claim 39, wherein the metal corrosion inhibitor is benzotriazole optionally substituted by at least one substituent selected from the group consisting of alkyl groups, aryl groups, halogen groups, amino groups, nitro groups, alkoxy groups, and hydroxyl groups.

41. The composition of claim 40, wherein the metal corrosion inhibitor is selected from the group consisting of benzotriazole, 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-dimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

42. The composition of claim 17, wherein the composition comprises from about 0.1% to about 0.6% by weight of the metal corrosion inhibitor.

43. The composition of claim 17, wherein the composition comprises from about 80% to about 99.7% of the water.

44. The composition of claim 17, further comprising at least one pH adjusting agent, the pH adjusting agent being a base free of a metal ion.

45. The composition of claim 44, wherein the pH adjusting agent is a quaternary ammonium hydroxide, a monoamine, an imine, or a guanidine salt.

\* \* \* \* \*